(12) United States Patent
Hu et al.

(10) Patent No.: US 8,188,377 B2
(45) Date of Patent: May 29, 2012

(54) CIRCUIT BOARD HAVING ELECTRICALLY CONNECTING STRUCTURE AND FABRICATION METHOD THEREOF

(75) Inventors: Wen-Hung Hu, Hsin-Chu (TW); Wen-Yuan Chi, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 828 days.

(21) Appl. No.: 12/229,422

(22) Filed: Aug. 21, 2008

(65) Prior Publication Data

US 2009/0050359 A1 Feb. 26, 2009

(30) Foreign Application Priority Data

Aug. 23, 2007 (CN) .................................. 96 1 31189

(51) Int. Cl.
*H02B 1/30* (2006.01)

(52) U.S. Cl. ........ 174/262; 174/258; 174/260; 438/614; 438/618; 257/737

(58) Field of Classification Search ............... 174/68.1, 174/250, 252, 255, 256, 258–268
See application file for complete search history.

(56) References Cited

U.S. PATENT DOCUMENTS

| | | | | |
|---|---|---|---|---|
| 6,436,735 B1 * | 8/2002 | Goetz et al. | | 438/125 |
| 7,847,400 B2 * | 12/2010 | Hu | | 257/737 |
| 2006/0079081 A1 * | 4/2006 | Hsu et al. | | 438/618 |
| 2006/0219567 A1 * | 10/2006 | Hu | | 205/125 |
| 2006/0225917 A1 * | 10/2006 | Hu | | 174/257 |
| 2006/0244140 A1 * | 11/2006 | Hu | | 257/737 |
| 2007/0161223 A1 * | 7/2007 | Hu et al. | | 438/613 |

* cited by examiner

*Primary Examiner* — Courtney Smith
(74) *Attorney, Agent, or Firm* — Peter F. Corless; Steven M. Jensen; Edwards Wildman Palmer LLP

(57) ABSTRACT

A circuit board having an electrically connecting structure and a method for fabricating the same are provided. A circuit board body having inner-layer circuits is provided. A circuit layer is formed on at least an outermost surface of circuit board body, and including electrically connecting pads and circuits. The electrically connecting pads are partially electrically connected to the circuits, and are partially electrically connected to the inner-layer circuits via conductive vias. An insulating protective layer is disposed on the circuit board body and is formed with openings therein for exposing the electrically connecting pads. Conductive posts are formed on the electrically connecting pads. Standalone metal pads are formed on the insulating protective layer but are not used for electrical connection. The conductive posts and electrically connecting pads are absent from the insulating protective layer beneath the standalone metal pads, such that circuits can be formed under the insulating protective layer.

3 Claims, 3 Drawing Sheets

CIRCUIT BOARD HAVING ELECTRICALLY CONNECTING STRUCTURE AND FABRICATION METHOD THEREOF

BACKGROUND OF THE INVENTION

1. Field of the Invention

The present invention relates to circuit boards and methods for fabricating the same, and more particularly, to a circuit board having an electrically connecting structure and a method for fabricating the circuit board.

2. Description of the Prior Art

The electronic industry has boomed and brought multi-functional and high-performance electronic products. For use with highly integrated and miniaturized semiconductor packages to incorporate more active components and package components therein, circuit boards having high-density circuit layout have been developed. The high-density circuit layout makes the circuit boards feasible for the miniaturized and multi-functional electronic products, allowing the circuit layout area in the circuit boards (having a limited space) to be increased by an interlayer connection technique, that is, more circuits and electronic components can be incorporated per unit area of the circuit boards. Thereby, such circuit boards are applicable to high-density integrated circuits while the thickness of the circuit boards may even be advantageously reduced.

It is also considered necessary to improve the functions, such as chip signal transmission, bandwidth enhancement, impedance control, etc., of the circuit boards in response to the computation requirements of microprocessors, chipsets and graphic chips and the high I/O number of packages. Further, the circuit boards have been made having fine circuits and small openings, so as for use with miniaturized, multi-functional, high-speed and high-frequency semiconductor packages. The circuit dimensions (including line width, pitch space, etc.) of the circuit boards have been decreased from 100 µm to less than 25 µm, and would be further decreased in the future.

Normally, electrically connecting pads formed on a surface of a multi-layer circuit board are used to allow the circuit board to be electrically connected to other electronic devices, such as a semiconductor chip or a passive component. However, not all electrode pads of the semiconductor chip or passive component are used for electrical connection. Some of the electrode pads, which are not for electrical connection, are used to prevent uneven distribution of stress when the semiconductor chip or passive component is electrically connected to the circuit board. This is important because uneven stress would cause delamination between the chip and the circuit board after an encapsulation process is completed, and excessive stress may even lead to cracking of the chip.

FIGS. 1A to 1D show a conventional method for fabricating a circuit board having an electrical connecting structure thereon. As shown in FIG. 1A, first, a circuit board body 10 having inner-layer circuits 100 is provided. A circuit layer 101 is formed on at least an outermost surface of the circuit board body 10. The circuit board body 10 also has a plurality of electrically connecting pads 102, 102', wherein some of the electrically connecting pads 102 are electrically connected to the circuit layer 101, some of the electrically connecting pads 102 are electrically connected to the inner-layer circuits 100 via conductive vias 103, and the remaining electrically connecting pads 102' are not used for electrical connection. An insulating protective layer 11 is further disposed on the circuit board body 10, wherein a plurality of openings 110 are formed in the insulating protective layer 11 to partially expose surfaces of the electrically connecting pads 102, 102'. Then, as shown in FIG. 1B, a conductive layer 12 is formed on the insulating protective layer 11, in the openings 110 and on the partially exposed surfaces of the electrically connecting pads 102, 102'. A resist layer 13 is disposed on the conductive layer 12, and is formed with a plurality of cavities 130 therein for exposing a portion of the conductive layer 12 located in the openings 110 of the insulating protective layer 11. As shown in FIG. 1C, a conductive material 14 is electroplated in the cavities 130 and the openings 110, and is thus formed on the electrically connecting pads 102, 102'. As shown in FIG. 1D, the resist layer 13 and a portion of the conductive layer 12 thereunder are removed so as to expose the conductive material 14.

It is not desirable that, the electrically connecting pads 102' are not used for electrical connection but are still required in the circuit layer 101, and the conductive material 14 has to be formed in the insulating protective layer 11. This arrangement is not spatially effective because the electrically connecting pads 102' (not for electrical connection) occupy a certain space of the circuit board where functional circuits cannot be disposed, thereby unfavorable for high circuit-density circuit boards with circuits being formed more and more densely.

Therefore, the problem to be solved here is to provide a circuit board with desirable electrically connecting pads that occupy little space of the circuit board, so as to enhance the circuit layout density and avoid uneven distribution of stress in forming electrical connection with other electronic components.

SUMMARY OF THE INVENTION

In view of the aforesaid drawbacks of the prior art, an objective of the present invention is to provide a circuit board having an electrically connecting structure and a method for fabricating the same, so as to increase the quantity and density of circuits disposed in the circuit board without increasing the area of the circuit board.

Another objective of the present invention is to provide a circuit board having an electrically connecting structure and a method for fabricating the same, so as to avoid uneven distribution of stress in forming electrical connection between the circuit board and other electronic components.

To achieve the above and other objectives, the present invention provides a circuit board having an electrically connecting structure, comprising: a circuit board body having inner-layer circuits, and a circuit layer formed on at least an outermost surface thereof, the circuit layer comprising a plurality of electrically connecting pads and circuits, wherein a portion of the electrically connecting pads is electrically connected to the circuits of the circuit layer, and another portion of the electrically connecting pads is electrically connected to the inner-layer circuits of the circuit board body via conductive vias, so as to allow the electrically connecting pads to be electrically connected to an external electronic component; an insulating protective layer disposed on the circuit board body, and formed with a plurality of openings therein to partially expose the electrically connecting pads; a plurality of conductive posts formed on the electrically connecting pads; and a plurality of standalone metal pads formed on the insulating protective layer, and not used for electrical connection.

The circuit board of the present invention further comprises: a conductive material disposed on the conductive posts or the standalone metal pads; and a conductive layer disposed between the electrically connecting pads and the conductive posts and between the standalone metal pads and the insulating protective layer. Some of the circuits of the circuit layer are disposed between some of the electrically connecting pads.

The present invention further provides a method for fabricating a circuit board having an electrically connecting structure, comprising the steps of: providing a circuit board body having inner-layer circuits and a circuit layer formed on at least an outermost surface thereof, the circuit layer comprising a plurality of electrically connecting pads and circuits, wherein a portion of the electrically connecting pads is electrically connected to the circuits of the circuit layer, and another portion of the electrically connecting pads is electrically connected to the inner-layer circuits of the circuit board body via conductive vias; forming an insulating protective layer on the circuit board body, and forming a plurality of openings in the insulating protective layer to partially expose the electrically connecting pads; forming a plurality of conductive posts on the electrically connecting pads in the openings, and forming a plurality of standalone metal pads on the insulating protective layer, wherein the standalone metal pads are not used for electrical connection; electroplating a conductive material on the conductive posts or the standalone metal pads; and removing the resist layer and a portion of the conductive layer covered by the resist layer.

By the above method of the present invention, the conductive posts and the standalone metal pads are fabricated by the steps of: forming a conductive layer on the insulating protective layer, in the openings and on the partially exposed electrically connecting pads in the openings; forming a resist layer on the conductive layer, and forming a plurality of first cavities and a plurality of second cavities in the resist layer, allowing the openings of the insulating protective layer to be exposed from the first cavities, and a portion of the conductive layer on the insulating protective layer to be exposed from the second cavities; and performing an electroplating process to form the conductive posts in the first cavities and the standalone metal pads in the second cavities.

Therefore, according to the circuit board having an electrically connecting structure and the method for fabricating the same in the present invention, the standalone metal pads are provided on the insulating protective layer, and the circuits are disposed in a portion of the insulating protective layer beneath the standalone metal pads, while the electrically connecting pads are absent from the portion of the insulating protective layer beneath the standalone metal pads. As a result, the quantity and density of circuits disposed in the circuit board can be increased, without having to increase the area of the circuit board. And, the standalone metal pads enhance uniform distribution of electrical connection points on the circuit board, thereby preventing uneven distribution of stress in forming electrical connection between the circuit board and other electronic components.

DETAILED DESCRIPTION OF THE EMBODIMENTS

Preferred embodiments of a circuit board having an electrically connecting structure and a method for fabricating the same proposed by the present invention are described in detail as follows with reference to FIGS. 2A to 2F. It should be understood that the drawings are simplified schematic diagrams only showing the components relevant to the present invention, and the layout of components could be more complicated in practical implementation.

FIGS. 2A to 2F are cross-sectional views showing the steps of a method for fabricating a circuit board having an electrically connecting structure according to the present invention.

Figure 1A:
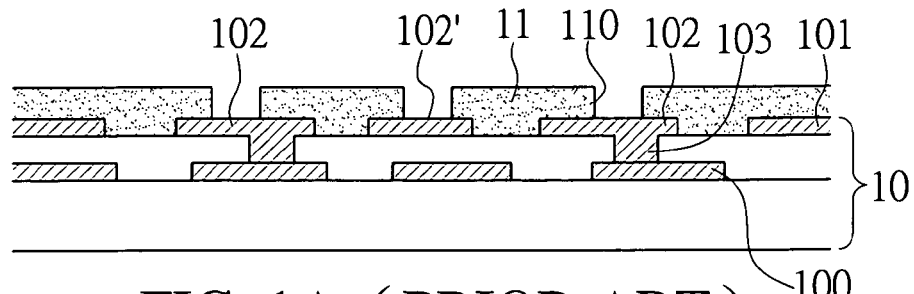
FIGS. 1A to 1D (PRIOR ART) are cross-sectional views showing the steps of a conventional method for fabricating a circuit board.
Figure 1B:
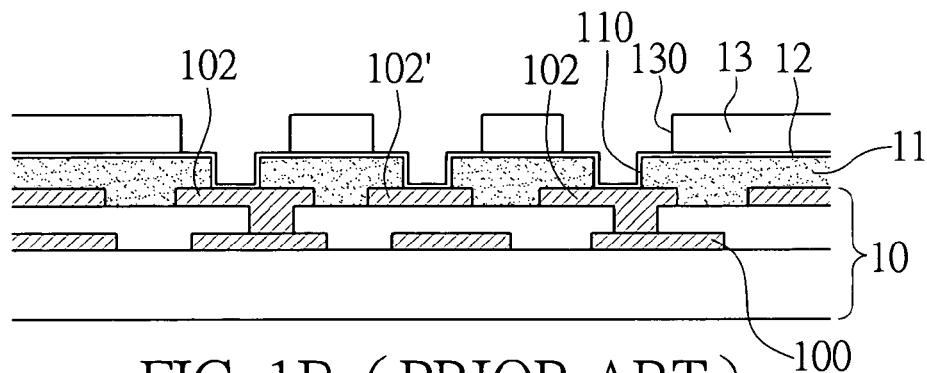
Figure 1C:
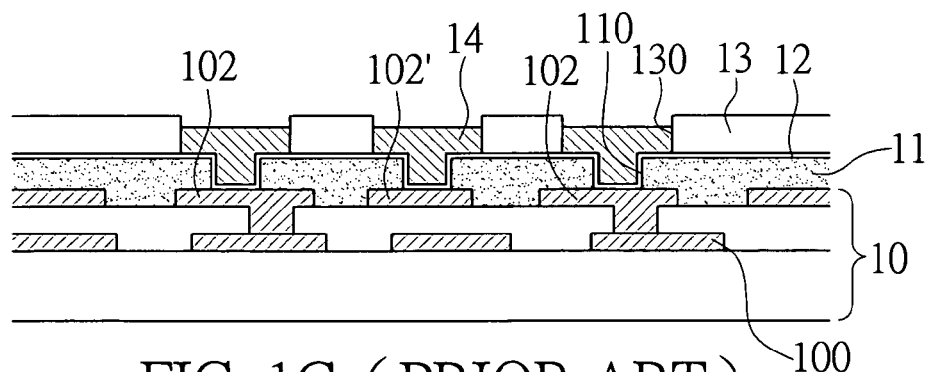
Figure 1D:
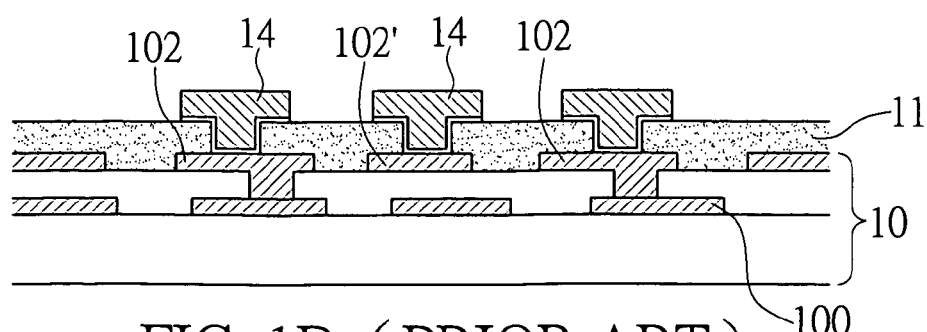
Figure 2A:
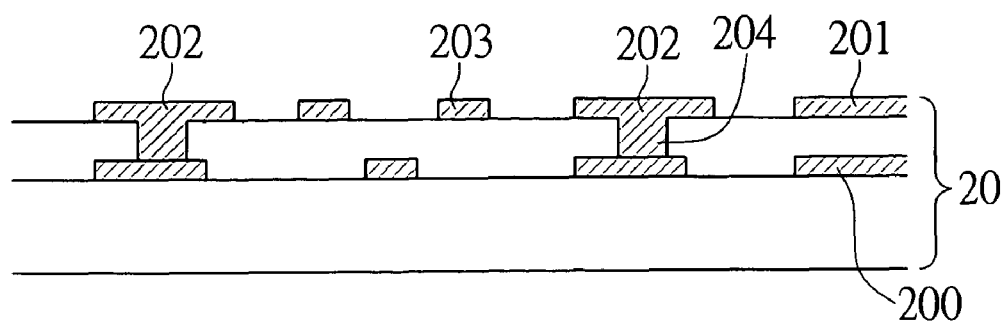
FIGS. 2A to 2F are cross-sectional views showing the steps of a method for fabricating a circuit board having an electrically connecting structure according to the present invention.

Referring to FIG. 2A, a circuit board body 20 having inner-layer circuits 200 is provided. A circuit layer 201 is formed on at least an outermost surface of the circuit board body 20. The circuit layer 201 comprises a plurality of electrically connecting pads 202 and circuits 203. A portion of the circuits 203 (not shown) is electrically connected to a portion of the electrically connecting pads 202. Another portion of the electrically connecting pads 202 is electrically connected to the inner-layer circuits 200 via a plurality of conductive vias 204. The term "portion" used here means "one or more". Some of the circuits 203 are disposed between some of the electrically connecting pads 202. The electrically connecting pads 202 are used to be electrically connected to an external electronic component (not shown).

Figure 2B:
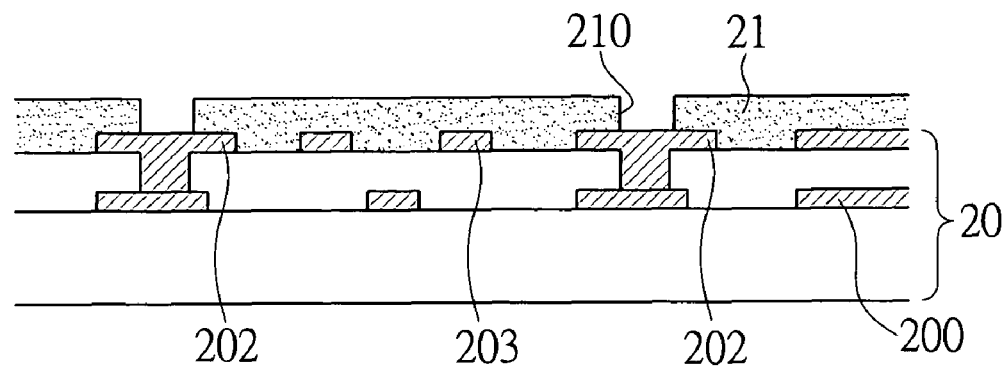

Referring to FIG. 2B, an insulating protective layer 21 is formed on the circuit board body 20, and a plurality of openings 210 are formed in the insulating protective layer 21 to partially expose surfaces of the electrically connecting pads 202.

Figure 2C:
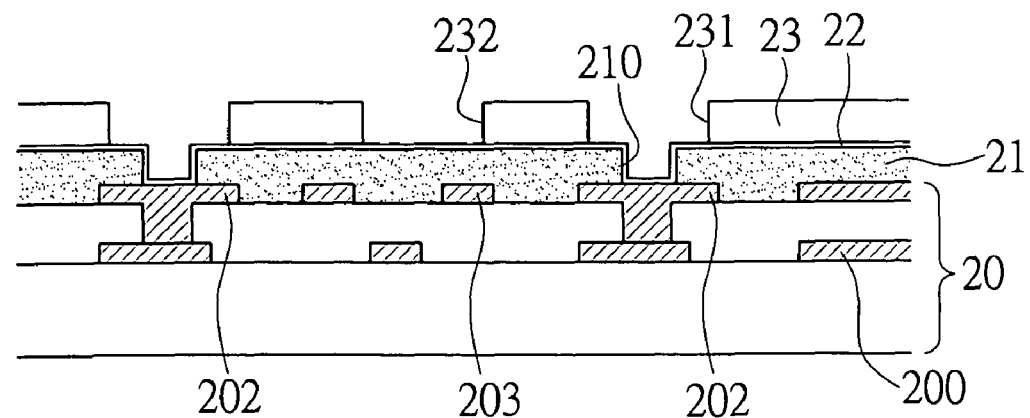

Referring to FIG. 2C, a conductive layer 22 is formed on the insulating protective layer 21, in the openings 210 and on the partially exposed surfaces of the electrically connecting pads 202 in the openings 210. The conductive layer 22 is formed by physical deposition or chemical deposition, such as sputtering, evaporation, arc vapor deposition, ion beam sputtering, laser ablation deposition, plasma enhanced chemical vapor deposition, or electroless plating. Then, a resist layer 23 is formed on the conductive layer 22, and is patterned by exposure and development to form a plurality of first cavities 231 and a plurality of second cavities 232 in the resist layer 23. The first cavities 231 expose the openings 210 of the insulating protective layer 21. The second cavities 232 are located between some of the first cavities 231 and expose a portion of the conductive layer 22 on the insulating protective layer 21.

Figure 2D:
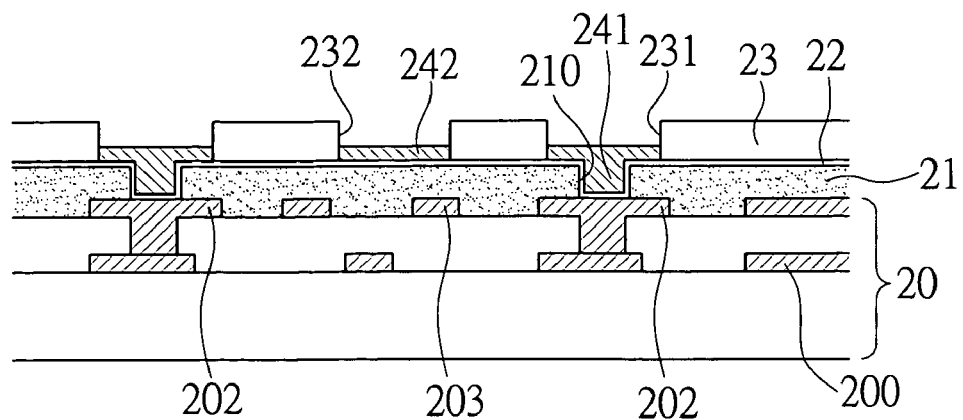

Referring to FIG. 2D, the conductive layer 22 functions as a current conduction path and thereby allows a plurality of conductive posts 241 to be formed (by electroplating) in the first cavities 231 respectively and a plurality of standalone metal pads 242 to be formed (by electroplating) in the second cavities 232 respectively. The standalone metal pads 242 are not used for electrical connection.

Figure 2E:
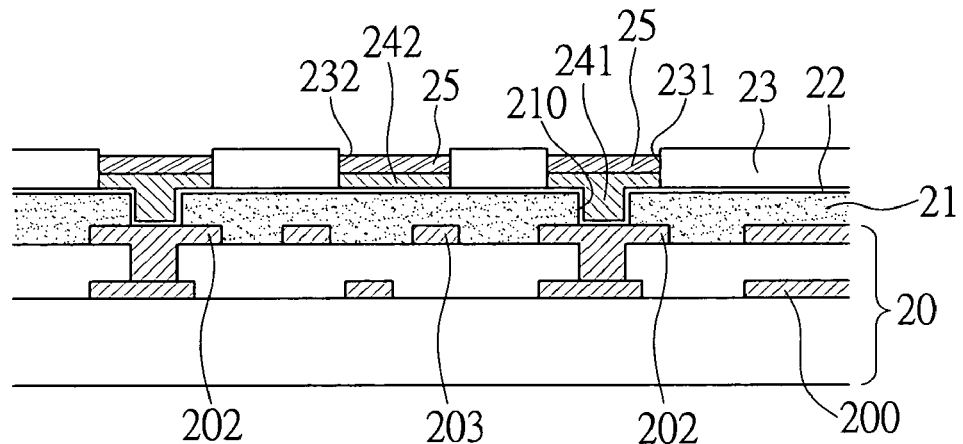

Referring to FIG. 2E, the electroplating process is continued to form a conductive material 25 on the conductive posts 241 and the standalone metal pads 242.

Figure 2F:
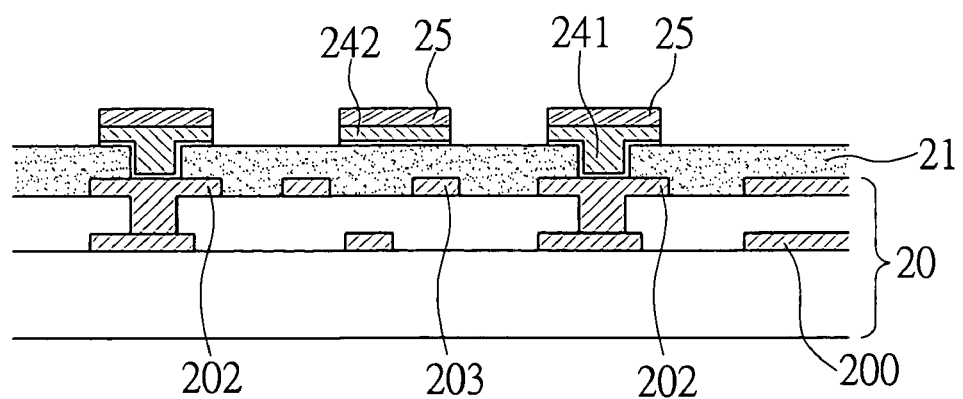

Referring to FIG. 2F, the resist layer 23 and a portion of the conductive layer 22 covered by the resist layer 23 are removed so as to expose the conductive posts 241, the standalone metal pads 242, and the conductive material 25.

Each of the standalone metal pads 242 is located between two adjacent ones of the conductive posts 241. At least one of the circuits 203 is disposed in a portion of the insulating protective layer 21 underneath the standalone metal pads 242 and between two adjacent ones of the electrically connecting pads 202. In other words, there is no electrically connecting pad provided in the portion of the insulating protective layer 21 underneath the standalone metal pads 242, thereby increasing the circuit layout space and the circuit layout density.

The present invention further provides a circuit board having an electrically connecting structure, comprising: a circuit board body 20 having a circuit layer 201 formed on at least an outermost surface thereof, the circuit layer 201 comprising a plurality of electrically connecting pads 202 and circuits 203, wherein a portion of the circuits 203 is electrically connected to the electrically connecting pads 202; an insulating protective layer 21 disposed on the circuit board body 20, and formed with a plurality of openings 210 therein for exposing the electrically connecting pads 202; a plurality of conductive posts 241 formed on the electrically connecting pads 202; a plurality of standalone metal pads 242 formed on the insulating protective layer 21, wherein the standalone metal pads 242 are not used for electrical connection; and a conductive material 25 disposed on the conductive posts 241 and the standalone metal pads 242.

The circuit board of the present invention further comprises a conductive layer 22 disposed between the electrically connecting pads 202 and the conductive posts 241 and between the standalone metal pads 242 and the insulating protective layer 21.

Therefore, according to the circuit board having an electrically connecting structure and the method for fabricating the same in the present invention, the standalone metal pads are provided on the insulating protective layer, and the circuits are disposed in a portion of the insulating protective layer beneath the standalone metal pads, while the electrically connecting pads are absent from the portion of the insulating protective layer beneath the standalone metal pads. As a result, the quantity and density of circuits disposed in the circuit board can be increased, without having to increase the area of the circuit board. And, the standalone metal pads enhance uniform distribution of electrical connection points on the insulating protective layer of the circuit board, thereby preventing uneven distribution of stress in forming electrical connection between the circuit board and other electronic components.

The foregoing specific embodiments are only illustrative of the features and functions of the present invention but are not intended to restrict the scope of the present invention. It is apparent to those skilled in the art that all equivalent modifications and variations made in the foregoing embodiments according to the spirit and principle in the disclosure of the present invention should fall within the scope of the appended claims.

What is claimed is:

1. A circuit board having an electrically connecting structure, comprising:
    a circuit board body having inner-layer circuits, and a circuit layer formed on at least an outermost surface thereof, the circuit layer comprising a plurality of electrically connecting pads and circuits, wherein a portion of the electrically connecting pads is electrically connected to the circuits of the circuit layer, and another portion of the electrically connecting pads is electrically connected to the inner-layer circuits of the circuit board body via conductive vias, so as to allow the electrically connecting pads to be electrically connected to an external electronic component;
    an insulating protective layer disposed on the circuit board body, and formed with a plurality of openings therein to partially expose the electrically connecting pads;
    a conductive layer disposed on the electrically connecting pads and the insulating protective layer;
    a plurality of conductive posts formed on the conductive layer disposed on the electrically connecting pads; and
    a plurality of standalone metal pads formed on the conductive layer disposed on the insulating protective layer, the standalone metal pads being free of having electrical connection with the electrically connecting pads and the circuits.

2. The circuit board of claim 1, further comprising a conductive material disposed on the conductive posts and the standalone metal pads.

3. The circuit board of claim 1, wherein a portion of the circuits of the circuit layer is disposed between some of the electrically connecting pads.

\* \* \* \* \*